(12) United States Patent
Okuda

(10) Patent No.: US 9,948,278 B2
(45) Date of Patent: Apr. 17, 2018

(54) FILTER DEVICE HAVING A FILTER CONNECTION CONDUCTOR LINE INCLUDING PARALLEL CONNECTED CONDUCTOR LINES

(71) Applicant: Murata Manufacturing Co., Ltd., Nagaokakyo-shi, Kyoto-fu (JP)

(72) Inventor: Tetsuro Okuda, Nagaokakyo (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 15/190,294

(22) Filed: Jun. 23, 2016

(65) Prior Publication Data

US 2016/0301385 A1    Oct. 13, 2016

Related U.S. Application Data

(63) Continuation of application No. PCT/JP2014/082564, filed on Dec. 9, 2014.

(30) Foreign Application Priority Data

Jan. 7, 2014  (JP) .................. 2014-000822

(51) Int. Cl.
*H03H 9/72*  (2006.01)
*H03H 9/70*  (2006.01)
(Continued)

(52) U.S. Cl.
CPC ............. *H03H 9/725* (2013.01); *H01P 1/184* (2013.01); *H01P 1/201* (2013.01); *H01P 1/213* (2013.01);
(Continued)

(58) Field of Classification Search
CPC .. H03H 9/0004; H03H 9/0009; H03H 9/0014; H03H 9/0028; H03H 9/0085; H03H 9/02992; H03H 9/0538; H03H 9/0542; H03H 9/0547; H03H 9/0557; H03H 9/0566; H03H 9/0571; H03H 9/0576; H03H 9/54;
(Continued)

(56) References Cited

U.S. PATENT DOCUMENTS 5,554,960 A *  9/1996  Ohnuki ................ H01P 1/2135
                                          333/132
6,765,456 B2 * 7/2004  Ehara ..................... H03H 9/725
                                          333/133
(Continued)

FOREIGN PATENT DOCUMENTS

JP     2011-160203 A     8/2011
WO    2007/145049 A1    12/2007
(Continued)

OTHER PUBLICATIONS

Official Communication issued in International Application PCT/JP2014/082564, dated Jan. 27, 2015.

*Primary Examiner* — Barbara Summons
(74) *Attorney, Agent, or Firm* — Keating & Bennett, LLP

(57) ABSTRACT

In a filter device, a first filter and a second filter are connected to a common connection point by a filter connection conductor line including a first conductor line portion, and a parallel connection area with an electrical length shorter than that in a single conductor line is provided in the first conductor line portion.

18 Claims, 11 Drawing Sheets

(51) Int. Cl.
*H03H 9/64* (2006.01)
*H03H 9/54* (2006.01)
*H01P 1/18* (2006.01)
*H01P 1/213* (2006.01)
*H01P 1/20* (2006.01)
*H03H 9/05* (2006.01)
*H03H 9/00* (2006.01)
*H01P 1/201* (2006.01)

(52) U.S. Cl.
CPC ......... *H01P 1/2135* (2013.01); *H03H 9/0009* (2013.01); *H03H 9/0014* (2013.01); *H03H 9/0028* (2013.01); *H03H 9/0557* (2013.01); *H03H 9/0576* (2013.01); *H03H 9/64* (2013.01); *H03H 9/706* (2013.01); *H03H 9/0085* (2013.01)

(58) Field of Classification Search
CPC .......... H03H 9/64; H03H 9/706; H03H 9/725; H01P 1/18; H01P 1/184; H01P 1/201; H01P 1/213; H01P 1/2135
USPC .......................................... 333/133
See application file for complete search history.

(56) References Cited

U.S. PATENT DOCUMENTS

| | | | |
|---|---|---|---|
| 6,781,479 B2* | 8/2004 | Ikada | H03H 9/0576 333/126 |
| 7,872,548 B2* | 1/2011 | Nishihara | H03H 9/0576 333/133 |
| 8,004,370 B2* | 8/2011 | Yamagata | H03H 9/02944 310/313 D |
| 8,354,895 B2* | 1/2013 | Kawamoto | H03H 9/02637 310/313 D |
| 2004/0227585 A1 | 11/2004 | Taniguchi et al. | |
| 2010/0319975 A1 | 12/2010 | Tsutsumi et al. | |
| 2011/0128092 A1 | 6/2011 | Fritz et al. | |
| 2012/0286896 A1 | 11/2012 | Takamine | |
| 2012/0293276 A1 | 11/2012 | Iwaki et al. | |

FOREIGN PATENT DOCUMENTS

| | | |
|---|---|---|
| WO | 2009/104251 A1 | 8/2009 |
| WO | 2011/092879 A1 | 8/2011 |

* cited by examiner

FILTER DEVICE HAVING A FILTER CONNECTION CONDUCTOR LINE INCLUDING PARALLEL CONNECTED CONDUCTOR LINES

BACKGROUND OF THE INVENTION

1. Field of the Invention

The present invention relates to filter devices preferably for use in duplexers or the like, for example.

2. Description of the Related Art

Various filter devices including a plurality of filters including different pass bands have been proposed. WO2007/145049 A1 discloses a duplexer for a cellular phone. According to the duplexer disclosed in WO2007/145049 A1, a transmission filter chip and a reception filter chip are mounted on a substrate. The transmission filter and the reception filter are connected to an antenna terminal provided on the substrate by a conductor line. A surface acoustic wave resonator is connected to a portion of the conductor line for connecting the filters that is located between the antenna terminal and the reception filter. The surface acoustic wave resonator includes a single interdigital transducer electrode including a single input terminal and a single output terminal.

Conventional duplexers such as that disclosed in WO2007/145049 A1 have had a problem of insufficient isolation characteristics between the transmission filter and the reception filter. The isolation can be improved by disposing the transmission filter chip and the reception filter chip farther away from each other. However, doing so increases the length of wiring between the transmission filter and a common connection point connected to the antenna terminal, or between the reception filter and the common connection point, which in turn increases the electrical length produced by the wiring in a high-frequency electric circuit. Accordingly, the optimum impedance matching between the transmission filter and the reception filter is not achieved. Such impedance mismatching is problematic in that it causes an increase in insertion loss.

Increasing the impedance of a resonator in the transmission filter or the reception filter is conceivable for correcting the impedance mismatching. However, the insertion loss increases in such a case as well.

SUMMARY OF THE INVENTION

Preferred embodiments of the present invention provide a filter device, including a plurality of band-pass filters, that has high isolation characteristics and in which an increase in insertion loss does not occur easily.

A filter device according to a preferred embodiment of the present invention includes a first filter including a first terminal and a second terminal and including a first pass band, a second filter including third and fourth terminals and including a second pass band that is different from the first pass band of the first filter, and a filter connection conductor line including a fifth terminal and a common connection point connected to the fifth terminal, the common connection point being connected to one of the first and second terminals and one of the third and fourth terminals. The filter connection conductor line includes a first conductor line portion connected to the common connection point and the first filter and a second conductor line portion connected to the common connection point and the second filter, and the first conductor line portion includes a parallel connection area in which a plurality of conductor lines are connected in parallel to each other so that an electrical length is shorter than in a case in which a single conductor line is provided.

According to a specific aspect of a filter device according to a preferred embodiment of the present invention, the filter device further includes a resonator connected to the parallel connection area and the first filter.

According to another specific aspect of a filter device according to a preferred embodiment of the present invention, the parallel connection area does not have a functional element.

According to yet another specific aspect of a filter device according to a preferred embodiment of the present invention, in the filter connection conductor line, a length of the second conductor line portion connected to the common connection point and the second filter is different from a length of the first conductor line portion.

According to still another specific aspect of a filter device according to a preferred embodiment of the present invention, in each conductor line of the plurality of conductor lines from one end to another end of the parallel connection area, a length of at least one of the conductor lines among the plurality of conductor lines is different from a length of another conductor line.

According to yet another specific aspect of a filter device according to a preferred embodiment of the present invention, the filter device further includes a substrate, and the first filter and the second filter are provided on the substrate.

According to still another specific aspect of a filter device according to a preferred embodiment of the present invention, the plurality of conductor lines in the parallel connection area are arranged alongside each other in a predetermined plane.

According to still another specific aspect of a filter device according to a preferred embodiment of the present invention, the plurality of conductor lines in the parallel connection area are provided in planes including different height positions.

According to various preferred embodiments of the present invention, the parallel connection area is provided in the filter connection conductor line, and thus a filter device achieving superior isolation characteristics and that does not easily experience an increase in insertion loss is provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be made clear hereinafter through descriptions of specific preferred embodiments of the present invention with reference to the drawings.

Figure 2:
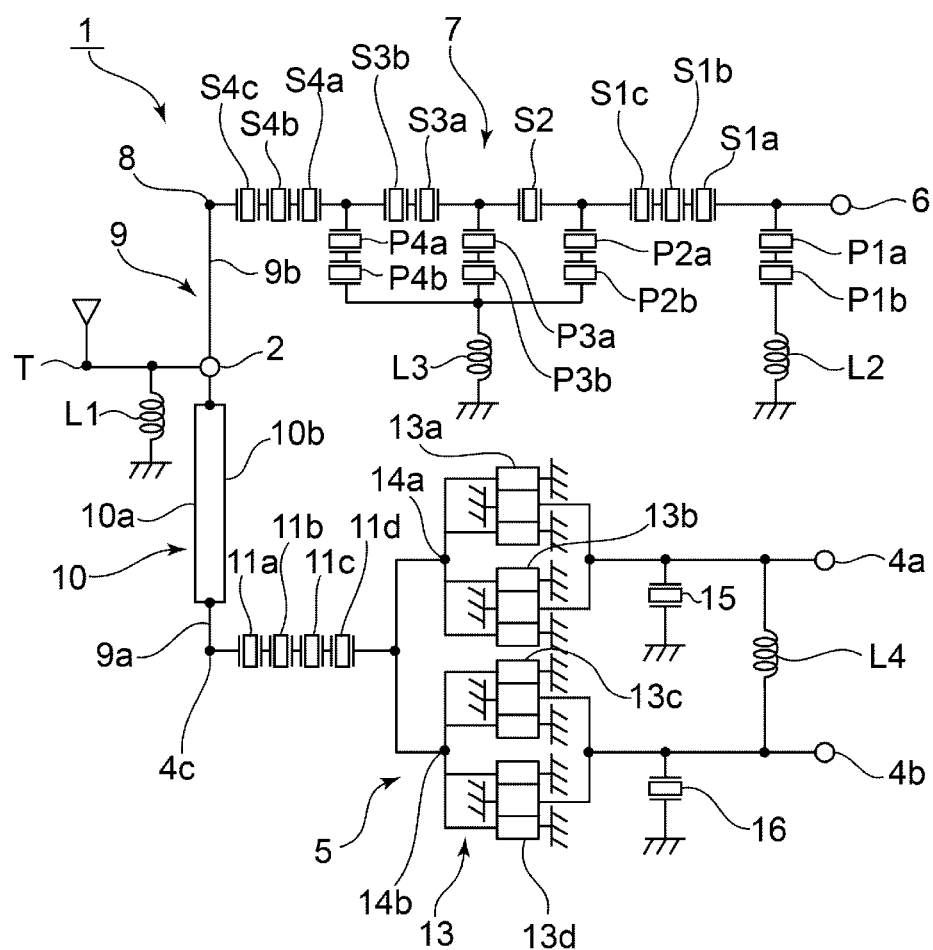
FIG. 2 is a circuit diagram illustrating a filter device according to the first preferred embodiment of the present invention.

FIG. 2 is a circuit diagram illustrating a filter device according to a first preferred embodiment of the present invention. A filter device 1 has a common connection point 2 connected to an antenna. An inductor L1 is connected between the common connection point 2 and a ground potential.

A first filter 5 is connected between the common connection point 2 and reception terminals 4a and 4b.

In the present preferred embodiment, the filter device 1 preferably is a duplexer, and the first filter 5 is a reception filter. Meanwhile, a second filter 7 is connected between the common connection point 2 and a transmission terminal 6. The second filter 7 is a transmission filter.

A terminal 4c on the common connection point 2 side of the first filter 5 corresponds to a first terminal, and the reception terminals 4a and 4b correspond to a second terminal. Meanwhile, a terminal 8 on the common connection point 2 side of the second filter 7 corresponds to a third terminal, and the transmission terminal 6 corresponds to a fourth terminal. The common connection point 2 is connected to a fifth terminal T. The fifth terminal T is connected to the antenna.

The terminal 4c of the first terminal and the terminal 8 of the third terminal are electrically connected to the common connection point 2. A filter connection conductor line 9 includes a first conductor line portion 9a connected to the fifth terminal T, common connection point 2, and first terminal 4c, and a second conductor line portion 9b connected to the common connection point 2 and third terminal 8.

Accordingly, the first conductor line portion 9a connects the common connection point 2 and the first filter 5. Likewise, the second conductor line portion 9b connects the common connection point 2 and the second filter 7.

A feature of the present preferred embodiment is that a parallel connection area 10 is provided in the first conductor line portion 9a of the filter connection conductor line 9. The parallel connection area 10 is an area where a plurality of conductor lines 10a and 10b through which communication signals pass are connected in parallel. The parallel connection area 10 is a conductor line area where an electrical length is shorter than in the case where a single conductor line of the same length is used. Accordingly, a conductor line area that is electrically short is able to be provided even when the parallel connection area 10 is physically long.

As such, isolation characteristics are able to be increased between the first filter 5 and the second filter 7 by increasing the length of the parallel connection area 10. Furthermore, in the present preferred embodiment, the parallel connection area 10 has a shorter electrical length than in the case where a single conductor line is used. This makes it difficult for insertion loss to increase. This will be described in greater detail later with reference to an experimental example.

As illustrated in FIG. 2, the second filter 7 is a ladder filter in the present preferred embodiment. In other words, a serial arm is connects the third terminal 8 and the transmission terminal 6. Serial arm resonators S1a to S1c, a serial arm resonator S2, serial arm resonators S3a and S3b, and serial arm resonators S4a to S4c are disposed in this serial arm, starting on the side where the transmission terminal 6 is located.

Meanwhile, first to fourth parallel arms are provided, in that order from the side where the transmission terminal 6 is located, so as to connect the serial arm and a ground potential. The first parallel arm connects the transmission terminal 6 and the ground potential. Parallel arm resonators P1a and P1b and an inductor L2 are connected to each other in series in the first parallel arm.

The second parallel arm connects a connection point between the serial arm resonator S1c and the serial arm resonator S2 to the ground potential. The third parallel arm connects a connection point between the serial arm resonator S2 and the serial arm resonator S3a to the ground potential. The fourth parallel arm connects a connection point between the serial arm resonator S3b and the serial arm resonator S4a to the ground potential. In the second to fourth parallel arms, parallel arm resonators P2a and P2b, parallel arm resonators P3a and P3b, and parallel arm resonators P4a and P4b, respectively, are connected to each other in series. Ground potential-side end portions of the parallel arm resonators P2b, P3b, and P4b are connected in common. An inductor L3 is connected between this common connection area and the ground potential.

Resonators using SAW or BAW can be used as the serial arm resonators and the parallel arm resonators. Note that the second filter 7 is not limited to being a ladder filter, and can also include a longitudinally coupled resonator type filter.

In the first filter 5, resonators 11a to 11d that are connected to each other in series are provided on the side where the first terminal 4c, which defines and functions as an input end, is located. A longitudinally coupled resonator type elastic wave filter 13 is connected to the resonator 11d. The elastic wave filter 13 is a band-pass filter including a balanced-unbalanced transforming function. The elastic wave filter 13 includes first to fourth elastic wave filter portions 13a to 13d, each of which has an odd number of interdigital transducers. The number of interdigital transducers in the elastic wave filter portions 13a to 13d that have an odd number of interdigital transducers is not limited as long as it is an odd number. In other words, a three-interdigital transducer type, a five-interdigital transducer type, a seven-interdigital transducer type, or the like can be used. The first and second elastic wave filter portions 13a and 13b are connected in parallel between a terminal 14a and the reception terminal 4a. Meanwhile, the third and fourth elastic wave filter portions 13c and 13d are connected in parallel between a terminal 14b and the reception terminal 4b. Output ends of the first and second elastic wave filter portions 13a and 13b are connected in common, and a resonator 15 is connected between the common connection area and the ground potential. Likewise, output ends of the third and fourth elastic wave filter portions 13c and 13d are connected in common. A resonator 16 is connected between this common connection area and the ground potential. An inductor L4 is connected between the reception terminal 4a and the reception terminal 4b.

A known configuration may be used for the first filter 5 and the second filter 7, such as an elastic wave filter device including a pass band, for example, an elastic wave device defined by a band-pass filter. The specific configurations of the first filter 5 and the second filter 7 are not particularly limited in various preferred embodiments of the present invention.

Figure 3:
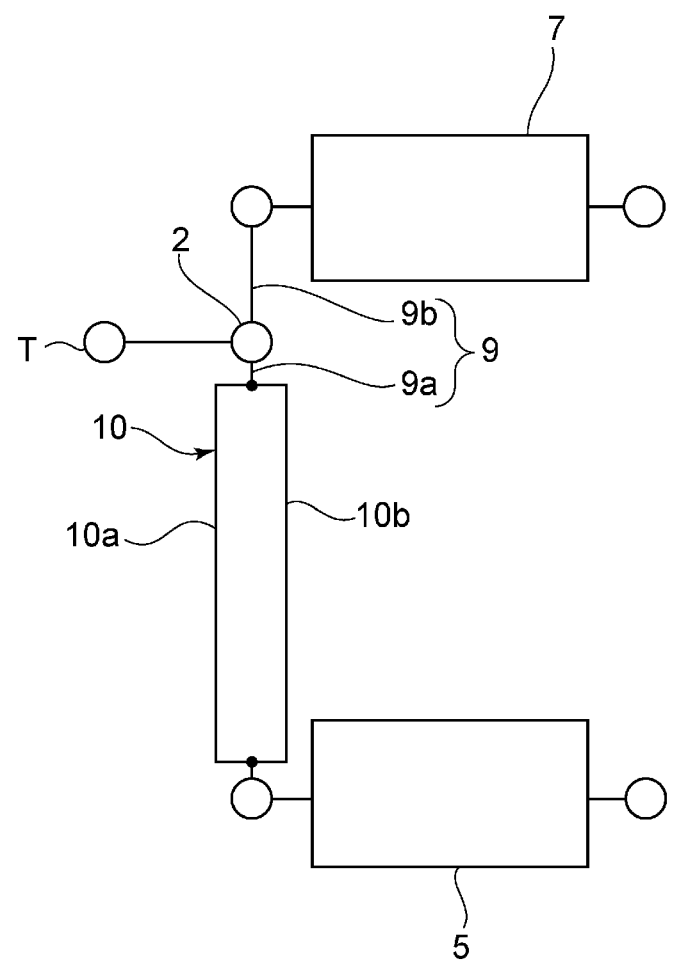
FIG. 3 is an overall schematic diagram illustrating circuitry of a filter device according to the first preferred embodiment of the present invention.

FIG. 3 is an overall schematic diagram illustrating circuit configurations of the filter device illustrated in FIG. 2. As can be seen from FIG. 3, the parallel connection area 10 is provided between the common connection point 2 and the first filter 5. In the example described in this preferred embodiment, the parallel connection area 10 includes two conductor line main body portions including the same length as each other and extending along a main surface of a substrate 21 with a constant interval therebetween, and conductor line connection portions that connect the end portions of the respective conductor lines to each other on both ends thereof. The conductor line main body portions are longer than the conductor line connection portions.

Figure 1:
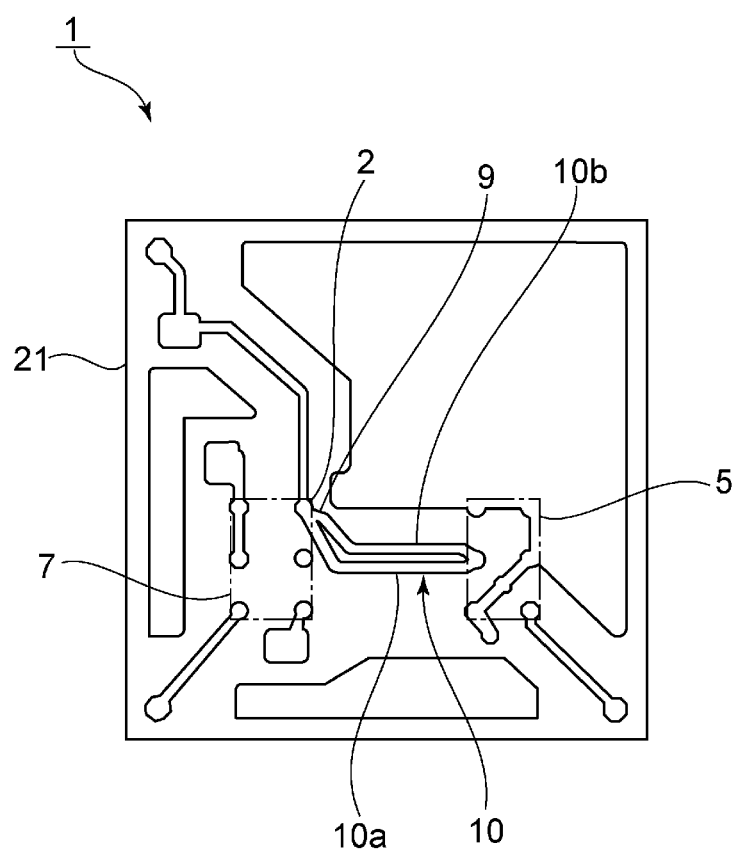
FIG. 1 is an overall plan view illustrating the physical structure of a filter device according to a first preferred embodiment of the present invention.

FIG. 1 is an overall plan view illustrating the physical structure of the filter device 1 according to the present preferred embodiment. The filter device 1 includes the substrate 21. A wiring pattern is provided on the substrate 21 as illustrated in the drawing. A filter chip of the first filter 5 is mounted on the substrate 21 as indicated by a dot-dash line.

A conductor line that electrically connects the first filter 5 and the second filter 7 is provided on a top surface of the substrate 21. More specifically, the common connection point 2 connected to the antenna is provided on the top surface of the substrate 21 and defined by a conductive film. A remaining portion of the filter connection conductor line 9 is also defined by a conductive film. Here, the common connection point 2 includes an electrode land located below the second filter 7 that defines the transmission filter. An electrical connection portion that connects the common connection point 2 and the second filter 7 that defines and functions as the transmission filter defines the second conductor line portion 9b illustrated in FIG. 2. On the other hand, a conductor line portion extending from the common connection point 2 toward the first filter 5 defines and functions as the first conductor line portion 9a illustrated in FIG. 2. The parallel connection area 10 is provided in the first conductor line portion 9a.

As described earlier, even when the length of the parallel connection area 10 is physically increased, the electrical length is able to be shortened as compared to a case where a single conductor line is used. As such, according to the filter device 1 of the present preferred embodiment, in the case where a phase between the first filter 5 and the second filter 7 has changed due to an increase in the distance between the two filters, the changed phase is able to be compensated for by reducing the electrical length of the conductor line. Through this, the isolation characteristics between the first filter 5 and the second filter 7 is able to be improved. Furthermore, it is also difficult for insertion loss to increase, as indicated in FIG. 4 and FIG. 5.

Figure 4:
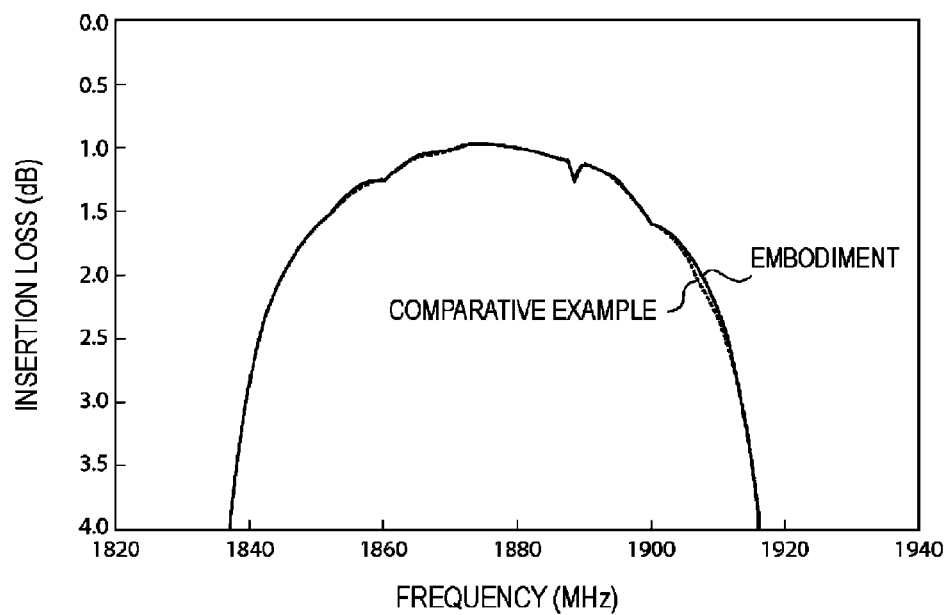
FIG. 4 is a diagram illustrating attenuation frequency characteristics of a second filter according to the first preferred embodiment of the present invention.
Figure 5:
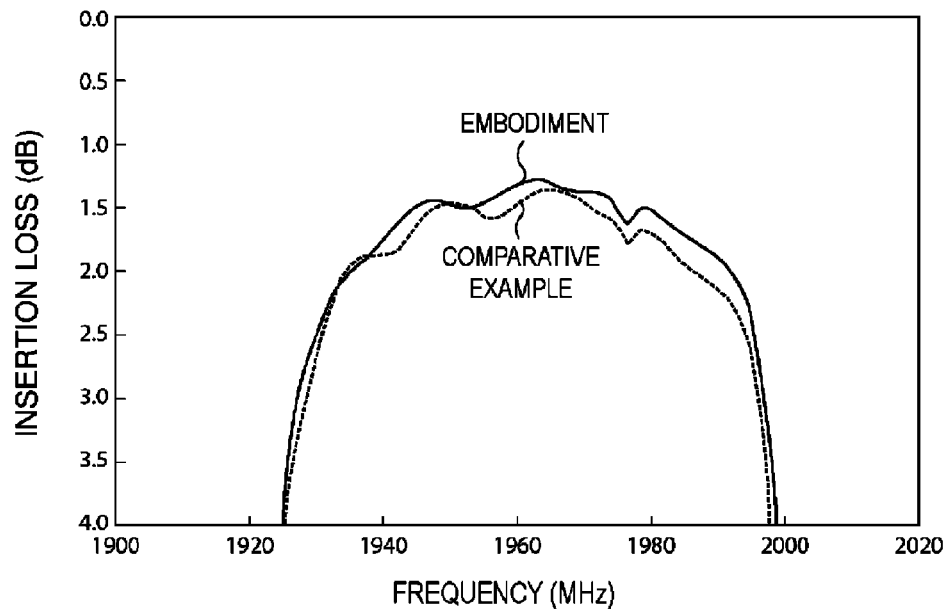
FIG. 5 is a diagram illustrating attenuation frequency characteristics of a first filter according to the first preferred embodiment of the present invention.

FIG. 4 indicates attenuation frequency characteristics of the pass band of the second filter, and FIG. 5 indicates attenuation frequency characteristics of the first filter. The solid lines in FIG. 4 and FIG. 5 indicate results of a working example of the first preferred embodiment, and the broken lines indicate attenuation frequency characteristics according to a comparative example in which the same configuration is used with the exception of a single conductor line of the same length being used instead of the parallel connection area.

Note that the design parameters of the first and second filters 5 and 7 were as follows in the working example.
Parameters of First Filter 5
The resonators 11a to 11d were configured as indicated in the following Table 1.

TABLE 1

| | Wave Length (μm) | Duty | No. Pairs (Pairs) | Cross Width (μm) |
|---|---|---|---|---|
| Resonators 11a to 11c | 1.94 | 0.58 | 98.0 | 23 |
| Resonator 11d | 2.02 | 0.58 | 190.0 | 45 |

The design parameters of the first to fourth elastic wave filter portions 13a to 13d were as indicated in the following Table 2. Note that the design parameters of the elastic wave filter portions 13a to 13d were the same. Here, each of the elastic wave filter portions 13a to 13d was a longitudinally coupled resonator type elastic wave filter unit including an odd number of interdigital transducers, namely as a seven interdigital transducer longitudinally coupled resonator type elastic wave filter unit whose seven interdigital transducers were arranged in a propagation direction of the elastic wave. In other words, the first interdigital transducer to the seventh interdigital transducer are provided in that order. In the region where the first interdigital transducer to the seventh interdigital transducer are provided, a first reflector is disposed at one end portion in the propagation direction of the elastic wave, and a second reflector is disposed at the other end portion in the propagation direction of the elastic wave.

TABLE 2

|  | Wave Length (μm) | Duty | No. Pairs (Pairs) | Cross Width (μm) |
|---|---|---|---|---|
| First Reflector | 2.04 | 0.68 | 13.5 | 30 |
| First Interdigital Transducer | 2.03 | 0.68 | 19.5 | 30 |
| Second Interdigital Transducer | 1.83 | 0.67 | 1.0 | 30 |
| Third Interdigital Transducer | 1.86 | 0.62 | 1.0 | 30 |
| Fourth Interdigital Transducer | 1.99 | 0.63 | 14.0 | 30 |
| Fifth Interdigital Transducer | 1.92 | 0.62 | 3.0 | 30 |
| Sixth Interdigital Transducer | 1.94 | 0.67 | 3.5 | 30 |
| Seventh Interdigital Transducer | 2.03 | 0.68 | 23.5 | 30 |
| Second Reflector | 2.04 | 0.68 | 13.5 | 30 |

The resonators 15 and 16 were designed as indicated in the following Table 3.

TABLE 3

|  | Wave Length (μm) | Duty | No. Pairs (Pairs) | Cross Width (μm) |
|---|---|---|---|---|
| Resonators 15 and 16 | 20.4 | 0.61 | 58.0 | 26 |

The value of the inductor L4 was 18 nH.

Design Parameters of Second Filter 7

The serial arm resonators S1a to S1c, S2, S3a, S3b, and S4a to S4c, and the parallel arm resonators P1a, P1b to P4a, and P4b were designed as indicated in the following Table 4.

TABLE 4

|  | P1a, P1b | S1a to S1c | P2a, P2b | S2 | P3a, P3b | S3a, S3b | P4a, P4b | S4a to S4c |
|---|---|---|---|---|---|---|---|---|
| Wave Length (main) | 1.971 | 1.898 | 1.978 | 1.899 | 1.961 | 1.911 | 1.985 | 1.902 |
| Wave Length (Ref.) | 1.971 | 1.898 | 1.978 | 1.899 | 1.961 | 1.911 | 1.985 | 1.902 |
| Cross Width | 35.6 | 28.8 | 38.1 | 38.9 | 30.1 | 36.4 | 59.1 | 40.2 |
| No. Pairs | 95.0 | 170.0 | 105.0 | 135.0 | 100.0 | 180.0 | 136.0 | 146.0 |
| No. Pairs (Ref.) | 9.5 | 9.5 | 9.5 | 9.5 | 9.5 | 9.5 | 9.5 | 9.5 |
| Duty | 0.475 | 0.475 | 0.475 | 0.430 | 0.475 | 0.475 | 0.475 | 0.475 |

The value of the inductor L2 was 3.3 nH, and the value of L3 was 1.0 nH.

In the aforementioned working example, the interval between the filter chips of the first filter 5 and the second filter 7 was 1000 μm.

Figure 6:
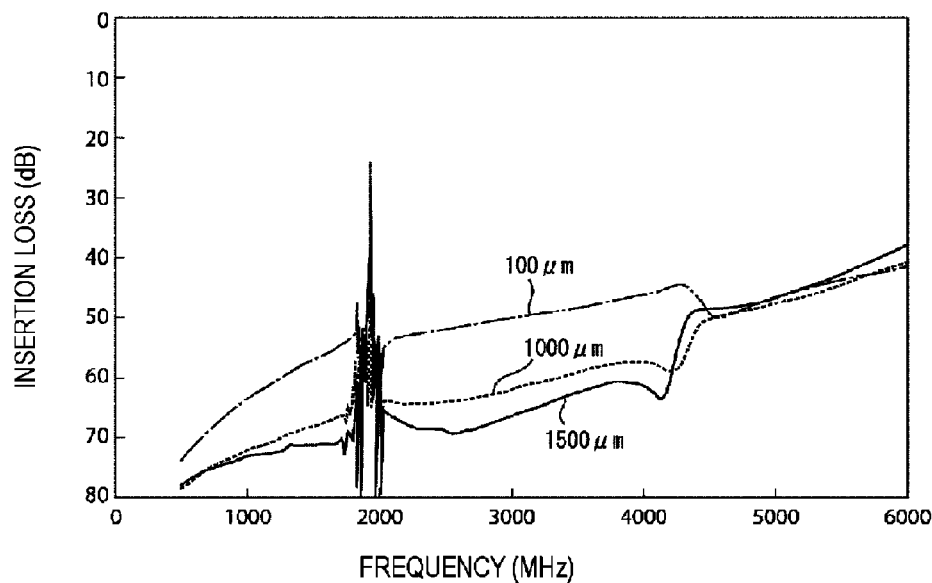
FIG. 6 is a diagram illustrating changes in isolation characteristics in the case where an interval between filter chips is varied, in an experimental example according to the first preferred embodiment of the present invention.

FIG. 6 illustrates isolation characteristics in the case where the interval between the filter chip is 100 μm, 1000 μm, and 1500 μm. In FIG. 6, the dot-dash line indicates a result for 100 μm, the broken line for 1000 μm, and the solid line for 1500 μm. As is clear from FIG. 6, the isolation characteristics can be improved by increasing the filter chip interval. In particular, as described in the above preferred embodiment, setting the filter chip interval to 1500 μm makes it possible to maintain sufficient isolation characteristics while significantly reducing or preventing an increasing in insertion loss as mentioned above. Furthermore, the conductor pattern in the conductor line may simply be changed to form the parallel connection area 10, which makes it difficult to incur increased costs.

The following can be considered as reasons why using the parallel connection area 10 makes it possible to improve the isolation characteristics while significantly reducing or preventing an increase in insertion loss.

As indicated in FIG. 6, the isolation characteristics improve as the physical interval between the one filter and the other filter increases. Meanwhile, the physical length of the first conductor line portion 9a increases and the electrical length increases as the interval between the two filters increases. Accordingly, impedance matching between the first filter 5 and the second filter 7 deviates from an optimal value. This is thought to lead to an increase in insertion loss.

Figure 7:
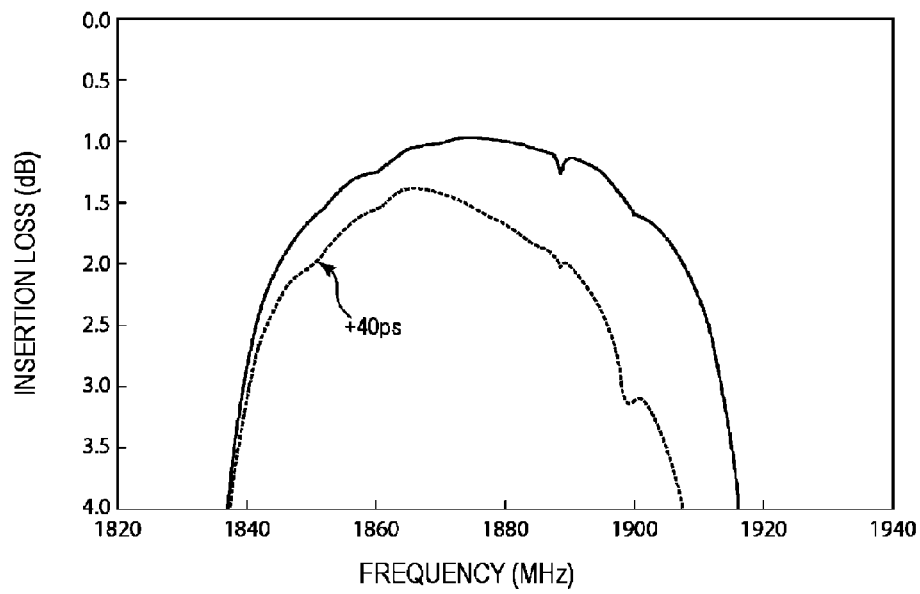
FIG. 7 is a diagram illustrating attenuation frequency characteristics of a second filter in the case where an interval between a common connection point and a first filter is varied.
Figure 8:
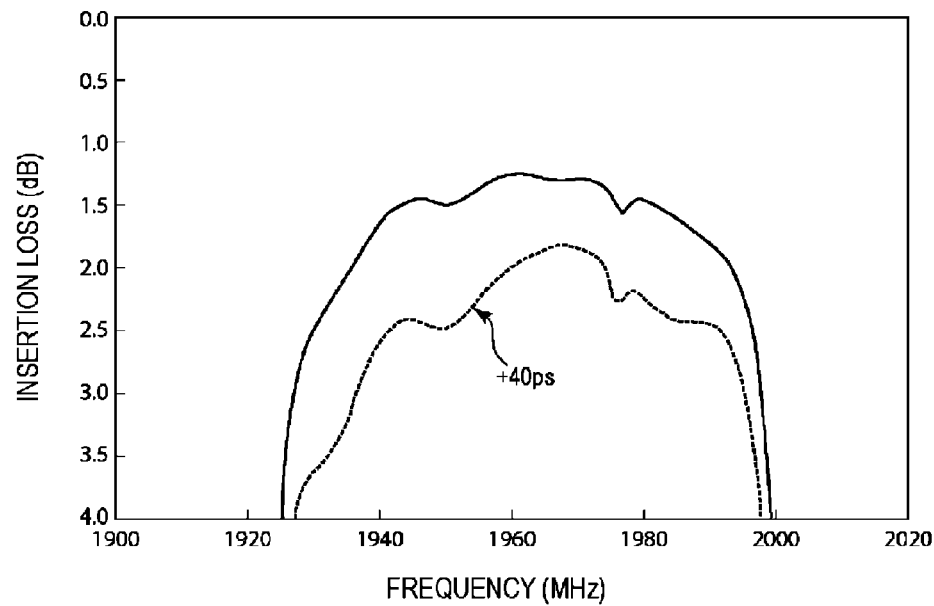
FIG. 8 is a diagram illustrating attenuation frequency characteristics of a first filter in the case where an interval between a common connection point and the first filter is varied.

FIG. 7 and FIG. 8 indicate changes in characteristics in the case where the filter chip interval is increased from a state in which the common connection point and the first filter 5 are brought close to each other. The characteristics indicated by the broken lines in FIG. 7 and FIG. 8 relative to the solid lines in FIG. 7 and FIG. 8 are results in the case where the interval has electrically increased by +40 (ps). FIG. 7 indicates attenuation frequency characteristics of the second filter, and FIG. 8 indicates attenuation frequency characteristics of the first filter.

As is clear from FIG. 7 and FIG. 8, increasing the interval results in an increase in insertion loss. This is caused by the impedance matching between the first filter 5 and the second filter 7 deviating from an optimal value.

Figure 9:
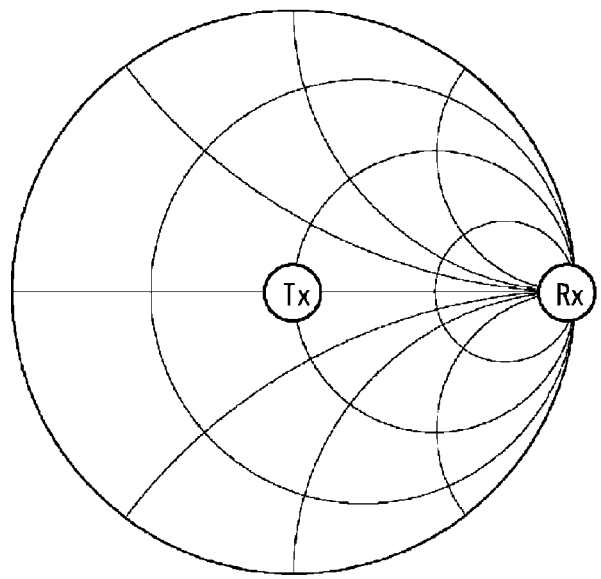
FIG. 9 is an impedance Smith chart indicating impedance characteristics of a second filter in a filter device according to the first preferred embodiment of the present invention.

In the filter device 1 according to the present preferred embodiment, for example, it is preferable for the second filter 7 of the transmission filter to have impedance characteristics as indicated in FIG. 9 in order to realize duplexer functionality. Likewise, it is preferable for the first filter 5 of the reception filter to have impedance characteristics as indicated in FIG. 10.

Figure 10:
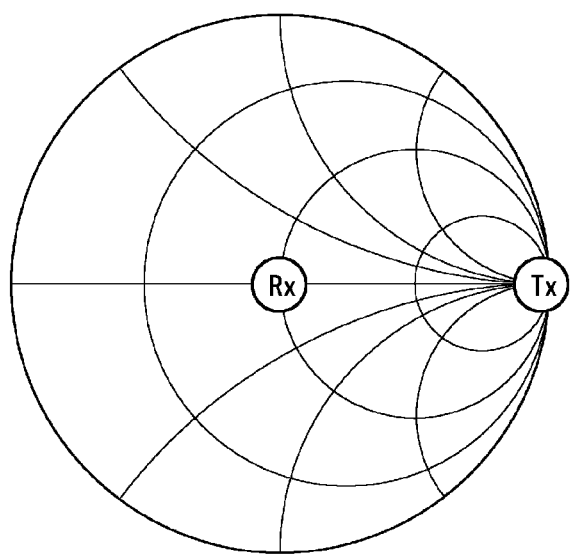
FIG. 10 is an impedance Smith chart indicating impedance characteristics of a first filter in a filter device according to the first preferred embodiment of the present invention.
Figure 11:
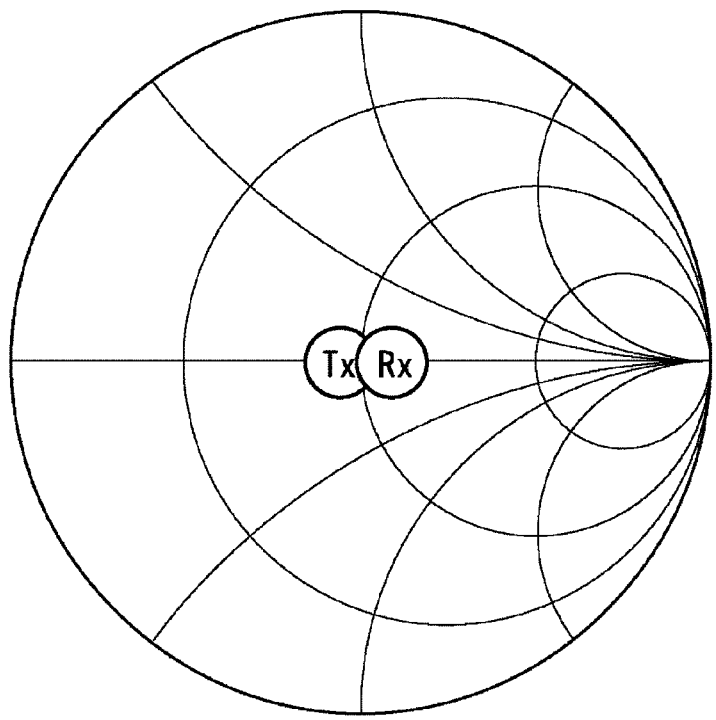
FIG. 11 is an impedance Smith chart illustrating a pass band, or in other words, a transmission band of a first filter at a common connection point in the case where the first filter and a second filter are connected in common.

Note that Tx and Rx in FIG. 9 to FIG. 11 indicate a transmission frequency band and a reception frequency band, respectively. In other words, it is preferable for the second filter 7 defining and functioning as the transmission filter to have impedance characteristics in which the impedance in the transmission frequency band Tx is 50Ω and the impedance in the reception frequency band Rx is in an open region of the Smith chart, or in other words, is located in a region indicating infinite impedance. It is preferable for the first filter 5 defining and functioning as the reception filter to have impedance characteristics in which the impedance in the reception frequency band Rx is 50Ω and the impedance in the transmission frequency band Tx is located in an open region of the Smith chart.

When two filters including impedance characteristics as described above are connected in common, in the transmission frequency band, the impedance value of 50Ω in the second filter 7 is connected in parallel with the open impedance of the first filter 5, and the parallel-connected impedances correspond to the impedance of the duplexer. The value thereof is 50Ω.

The same preferably is applied to the reception frequency band. To rephrase, in the first and second filters 5 and 7 connected in common at the common connection point 2, when the pass band impedance of the partner filter deviates from the open region on the Smith chart, the impedance of the duplexer will deviate from 50Ω, as indicated in FIG. 11. As indicated in FIG. 7 and FIG. 8, it is thought that the increase in insertion loss is caused by the electrical length of the first conductor line portion 9a increasing and the transmission frequency band impedance in the first filter 5 of the reception filter deviating from open as a result. In other words, it is thought that the overall impedance of the duplexer will deviate from 50Ω, causing an increase in the insertion loss.

Figure 16:
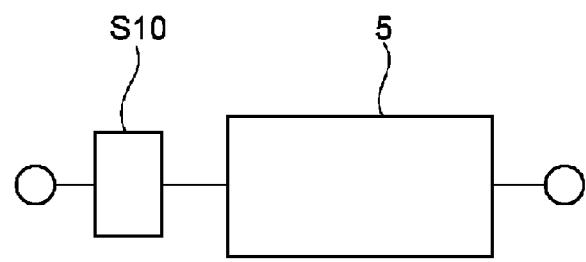
FIG. 16 is an overall circuit diagram illustrating a circuit in which a resonator is connected in series to a first filter.
Figure 17:
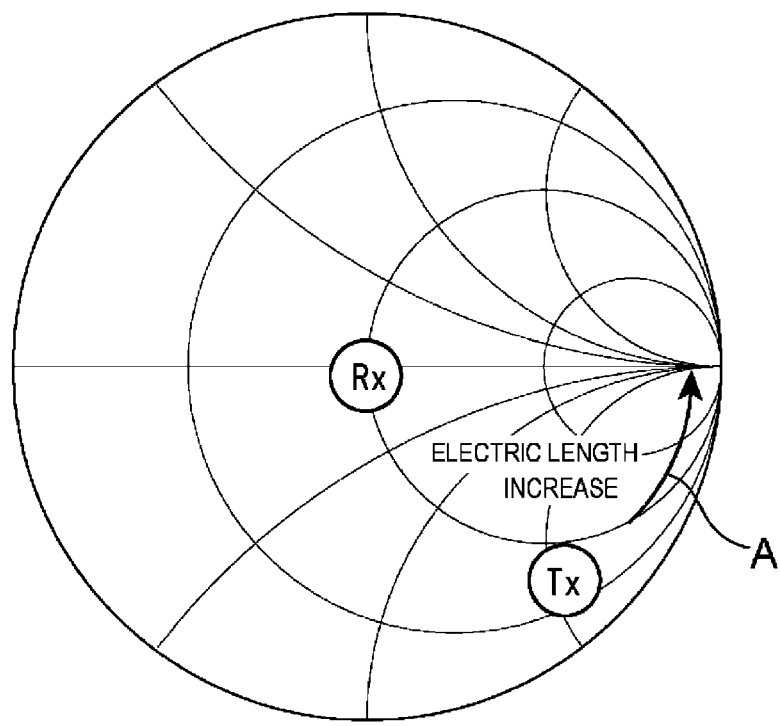
FIG. 17 is an impedance Smith chart illustrating impedance matching effects of the circuit illustrated in FIG. 16.

However, in the case where the insertion loss increases in such a manner, the transmission frequency band impedance in the first filter 5 of the reception filter may be set to open. As illustrated in FIG. 16, by connecting a serial resonator S10 in series as a previous stage of the first filter 5, the impedance is able to be corrected in the direction of the arrow A in FIG. 17. In other words, the transmission frequency band impedance in the first filter 5 of the reception filter may be brought toward open by connecting the serial resonator S10.

However, the insertion loss will inevitably increase with this method of impedance adjustment as well. In other words, with the method that compensates for the increased electrical length due to the increased wiring length by connecting the serial resonator S10, it is preferable to adjust the impedance of the serial resonator S10 higher. The loss of the first filter 5 of the reception filter will ultimately increase in a configuration where the real part of the impedance of the first filter 5 is increased by connecting the serial resonator S10.

As opposed to this, in the present preferred embodiment, providing the parallel connection area 10 makes it possible to reduce the electrical length of the conductor line portion even when the physical length of the wiring is increased. In the present preferred embodiment, when the imaginary part of the impedance is changed and the electrical length is shortened, the filter impedance is able to be moved, on the Smith chart, in the counter-clockwise direction relative to the center of the Smith chart. Accordingly, the influence on the impedance matching is able to be reduced. It is therefore possible to significantly reduce or prevent an increase in the insertion loss.

Furthermore, because the parallel connection area 10 may simply be provided in the first conductor line portion 9a, another functional element to adjust the impedance is not required. In other words, forming an inductor L, a capacitor C, or the like is not preferable. The parallel connection area does not have such functional elements. Accordingly, the impedance matching is able to be achieved using wiring only, and an increase in the insertion loss is able to be significantly reduced or prevented. Furthermore, because impedance matching is realized even with a configuration realized from pure wiring portions that do not have inductance components or capacitance components, radiation of electromagnetic waves caused by LC resonance can in theory be significantly reduced or prevented, which makes it difficult for external circuits to be affected. There is furthermore less influence from external circuits as well.

Note that an increase in insertion loss cannot be significantly reduced or prevented simply by adjusting the impedance by connecting the serial resonator S10 as a previous stage to the first filter 5 as indicated in FIG. 16. However, in the present invention, the resonators 11a to 11d may be connected in series as previous stages to the first filter 5, as in the first preferred embodiment. In other words, the resonators 11a to 11d connected between the parallel connection area 10 and the first filter 5 may further be included. In such a case, an improvement in isolation and a significant reduction or prevention of an increase in insertion loss is able to be achieved due to both the effect of providing the parallel connection area 10 and the impedance adjustment function provided by the resonators.

Figure 12:
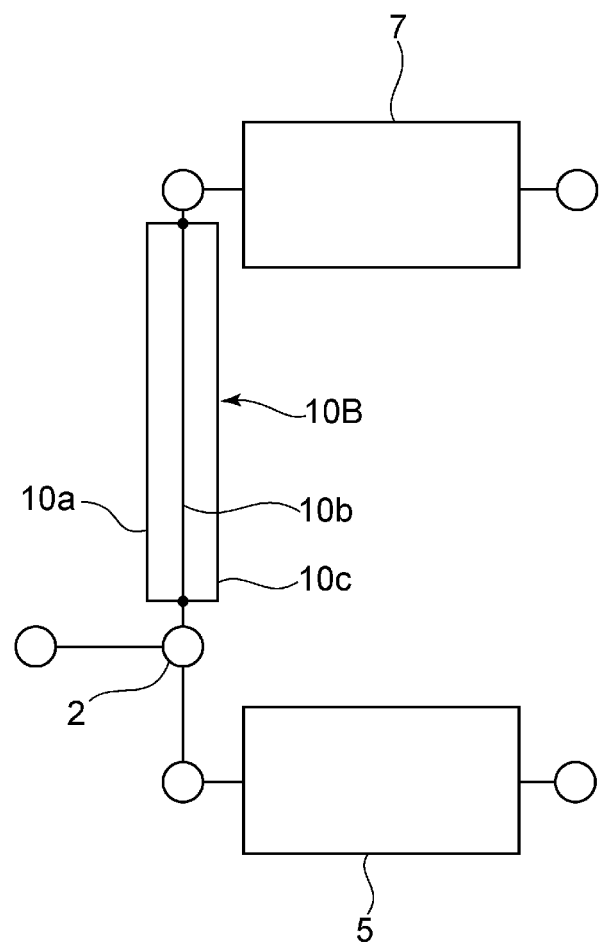
FIG. 12 is an overall schematic diagram illustrating a filter device according to a second preferred embodiment of the present invention.

FIG. 12 is an overall schematic diagram illustrating a filter device according to a second preferred embodiment of the present invention. In the first preferred embodiment, the parallel connection area 10 is provided in the first conductor line portion 9a between the common connection point 2 and the first filter 5. As opposed to this, a parallel connection area 10B may be disposed in the second filter 7 side, as indicated schematically in FIG. 12. Here, the parallel connection area 10B is provided in the second conductor line portion that connects the common connection point 2 and the second filter 7.

Note that three conductor lines 10a to 10c may be connected in parallel, as in the parallel connection area 10B illustrated in FIG. 12. The number of conductor lines connected in parallel in the parallel connection area is not particularly limited.

Although the first terminal of the first filter and the third terminal of the second filter are connected in common to the common connection point in the first and second preferred embodiments, it should be noted that in various preferred embodiments of the present invention, the first filter 5 including the first and second terminals and the second filter 7 including the third and fourth terminals may be configured with the second terminal and the fourth terminal connected in common. In other words, various preferred embodiments of the present invention are able to be widely applied in a configuration in which one of the first and second terminals of the first filter and one of the third and fourth terminals of the second filter are connected in common to the common connection point.

Figure 13:
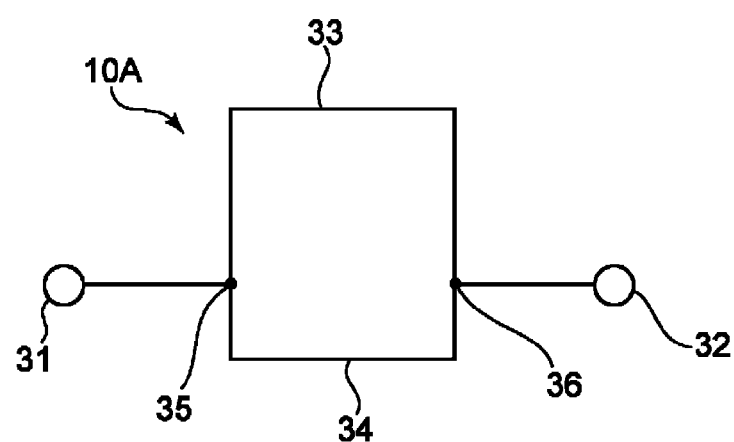
FIG. 13 is a plan view illustrating a parallel connection area according to a third preferred embodiment of the present invention.

Meanwhile, FIG. 13 is a plan view illustrating a parallel connection area according to a third preferred embodiment of the present invention. In a parallel connection area 10A, a first conductor line 33 and a second conductor line 34 are connected in parallel between one end portion 31 and another end portion 32. However, a path from a connection point 35 to a connection point 36 through the first conductor line 33 is different from a path from the connection point 35 to the connection point 36 through the second conductor line 34. In other words, the path on the second conductor line 34 is shorter. In this manner, the parallel connection area may have conductor lines whose path lengths between the connection points 35 and 36 are different.

Figure 14:
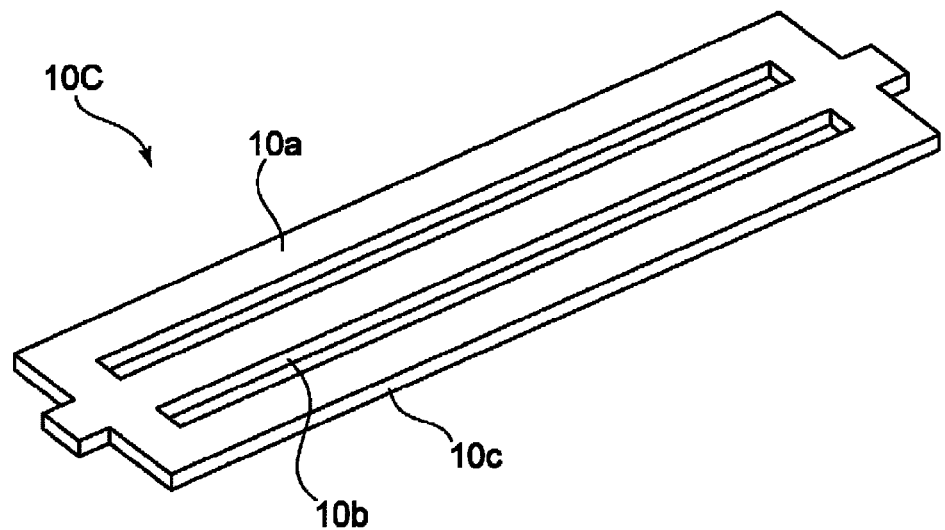
FIG. 14 is a perspective view illustrating a variation on a parallel connection area according to a preferred embodiment of the present invention.
Figure 15:
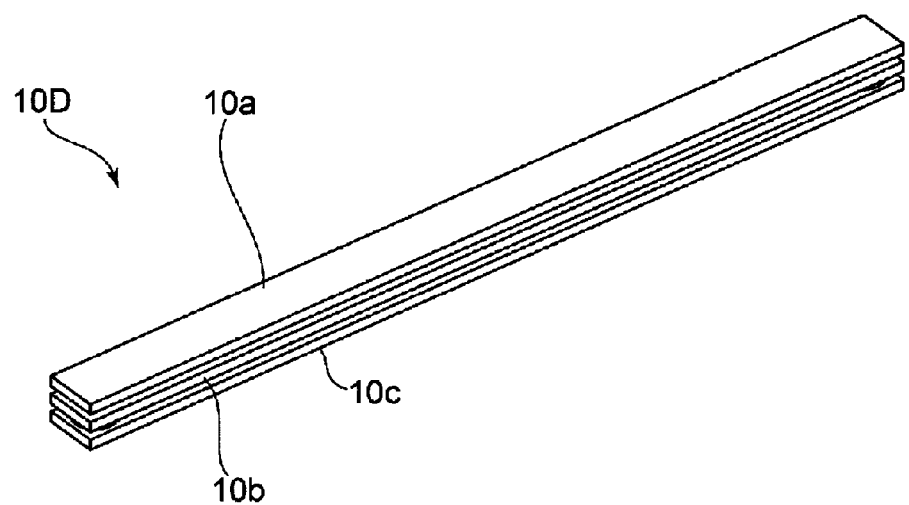
FIG. 15 is an overall perspective view illustrating another variation on a parallel connection area according to a preferred embodiment of the present invention.

FIG. 14 is a perspective view illustrating a variation on the parallel connection area. In a parallel connection area 10C, the conductor lines 10a to 10c are disposed so as to be parallel within the same plane. In other words, a plurality of conductor lines 10a to 10c are arranged in parallel within the same plane. As opposed to this, the plurality of conductor lines 10a to 10c may be disposed separately within different planes located at different height positions in a normal direction of a primary surface of a multilayer substrate, or in other words, in a thickness direction thereof, as in a parallel connection area 10D according to a variation and indicated in FIG. 15. The parallel connection area may be formed by disposing the conductor lines 10a to 10c separately across a plurality of layers at different height positions in the thickness direction of a multilayer substrate and then connecting both ends of the conductor lines using connection electrodes or the like, for example.

Various preferred embodiments of the present invention are able to be applied not only in a duplexer that demultiplexes a transmission signal and a reception signal using filters, but also in a multiplexer that demultiplexes three or more signals. Furthermore, various preferred embodiments of the present invention are able to be applied in a diplexer that demultiplexes transmission signals or that demultiplexes reception signals using filters. The filters may include only by ladder-type elastic wave filters, or may include only by longitudinally coupled resonator type elastic wave filters. The resonators in the ladder filter may include by BAW resonators.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
   a substrate;
   a first filter including a first terminal and a second terminal and including a first pass band;
   a second filter including third and fourth terminals and including a second pass band that is different from the first pass band of the first filter; and
   a filter connection conductor line including a fifth terminal and a common connection point connected to the fifth terminal, the common connection point being connected to one of the first and second terminals and one of the third and fourth terminals; wherein
   the filter connection conductor line includes a first conductor line portion connected to the common connection point and the first filter and a second conductor line portion connected to the common connection point and the second filter;
   the first conductor line portion includes a parallel connection area in which a plurality of conductor lines are connected in parallel to each other so that an electrical length is shorter than in a case in which a single conductor line is provided;
   the first filter and the second filter are mounted on the substrate; and
   the parallel connection area is provided in the substrate.

2. The filter device according to claim 1, further comprising a resonator connected to the parallel connection area and the first filter.

3. The filter device according to claim 1, wherein the parallel connection area does not have a functional element.

4. The filter device according to claim 1, wherein in the filter connection conductor line, a length of the second conductor line portion connected to the common connection point and the second filter is different from a length of the first conductor line portion.

5. The filter device according to claim 1, wherein in each conductor line of the plurality of conductor lines from one end to another end of the parallel connection area, a length of at least one of the plurality of conductor lines is different from a length of another one of the plurality of conductor lines.

6. The filter device according to claim 1, wherein the parallel connection area is located between the common connection point and the first filter.

7. The filter device according to claim 1, wherein the plurality of conductor lines in the parallel connection area extend alongside each other in a predetermined plane.

8. The filter device according to claim 1, wherein the plurality of conductor lines in the parallel connection area are distributed among a plurality of planes including different height positions.

9. The filter device according to claim 1, wherein the filter device is a duplexer.

10. The filter device according to claim 1, wherein the first filter is a reception filter.

11. The filter device according to claim 1, wherein the second filter is a transmission filter.

12. The filter device according to claim 1, wherein the fifth terminal is connected to an antenna.

13. The filter device according to claim 1, wherein the second filter is one of a ladder filter and a longitudinally coupled resonator type filter.

14. The filter device according to claim 1, further comprising a serial arm that connects the third terminal to the fourth terminal which is a transmission terminal.

15. The filter device according to claim 14, further comprising parallel arms that connect the serial arm to a ground potential.

16. A filter device comprising:
   a substrate;
   a first filter including a first terminal and a second terminal and including a first pass band;
   a second filter including third and fourth terminals and including a second pass band that is different from the first pass band of the first filter; and
   a filter connection conductor line including a fifth terminal and a common connection point connected to the fifth terminal, the common connection point being connected to one of the first and second terminals and one of the third and fourth terminals; wherein
   the filter connection conductor line includes a first conductor line portion connected to the common connection point and the first filter and a second conductor line portion connected to the common connection point and the second filter;
   the second conductor line portion includes a parallel connection area in which a plurality of conductor lines are connected in parallel to each other so that an electrical length is shorter than in a case in which a single conductor line is provided;
   the first filter and the second filter are mounted on the substrate; and
   the parallel connection area is provided in the substrate.

17. The filter device according to claim 16, wherein the parallel connection area does not have a functional element.

18. The filter device according to claim 16, wherein in each conductor line of the plurality of conductor lines from one end to another end of the parallel connection area, a length of at least one of the plurality of conductor lines is different from a length of another one of the plurality of conductor lines.

* * * * *